United States Patent [19]
Wu

[11] Patent Number: 5,909,620
[45] Date of Patent: Jun. 1, 1999

[54] METHOD FOR A RING-LIKE CAPACITOR IN A SEMICONDUCTOR MEMORY DEVICE

[75] Inventor: Shye Lin Wu, Hsinchu, Taiwan

[73] Assignee: Acer Semiconductor Manufacturing Inc., Hsinchu, Taiwan

[21] Appl. No.: 08/988,031

[22] Filed: Dec. 10, 1997

[30] Foreign Application Priority Data

Jun. 27, 1997 [TW] Taiwan ................................ 86109227

[51] Int. Cl.$^6$ .............................................. H01L 21/8242
[52] U.S. Cl. ............................................ 438/253; 438/254
[58] Field of Search .................................. 438/253–256, 438/396–398

[56] References Cited

U.S. PATENT DOCUMENTS

5,104,821  4/1992  Choi et al. ................................. 437/52
5,330,614  7/1994  Ahn .
5,643,819  7/1997  Tseng .
5,663,093  9/1997  Tseng et al. .

*Primary Examiner*—Jey Tsai
*Attorney, Agent, or Firm*—Robert H. Chen

[57] ABSTRACT

This invention discloses a novel design to fabricate a ring-like capacitor in a semiconductor memory device for increasing the area of the capacitor electrodes. The ring-like conductive structure of the electrode of the capacitor includes a mushroom-shaped member having a flat-headed cap and a stem coupled to the source region of the semiconductor memory device, a solid cylindrical member disposed on the cap of the mushroom-shaped member, and a side-wall spacer being a hollow cylindrical member disposed on the cap of said mushroom-shaped member to increase the area of the capacitor electrodes thereby increasing the capacitance of the capacitor to provide a sufficient capacitance while maintaining high integration in semiconductor memory cells.

28 Claims, 6 Drawing Sheets

METHOD FOR A RING-LIKE CAPACITOR IN A SEMICONDUCTOR MEMORY DEVICE

BACKGROUND OF THE INVENTION

1. Field of the Invention

This invention relates to a capacitor in a semiconductor memory device and its fabrication method, and more particularly to a capacitor in a semiconductor memory device having a ring-like structure.

2. Background of the Invention

Figure 1A:
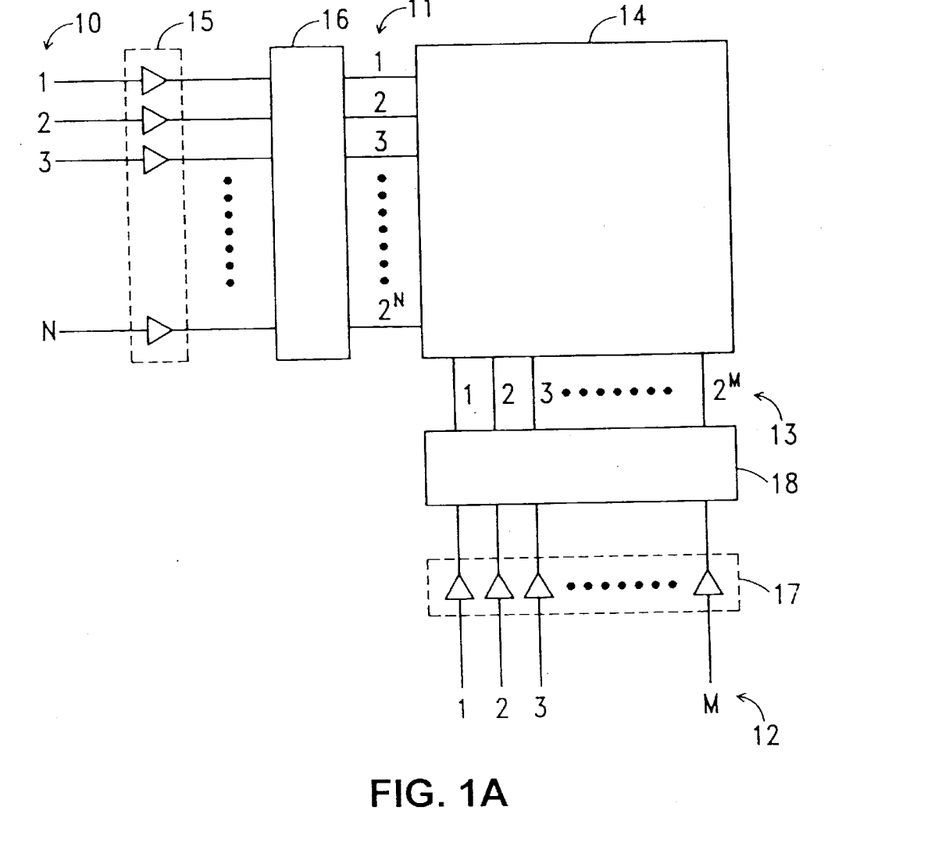
FIG. 1A shows a simplified block diagram of prior art memory cell and its related system.

Because electronic and computer products are widely used today, semiconductor memory devices are in great demand. FIG. 1A shows a simplified block diagram of a prior art memory device 14 and its related system. The memory cells of memory 14 are arranged with an array structure consisting of rows and columns. All of the horizontal lines connected with memory 14 are called word lines 11, and all of the vertical lines connected with memory 14 are called bit lines 13. All data accessing is done through bit lines 13.

Figure 1B:
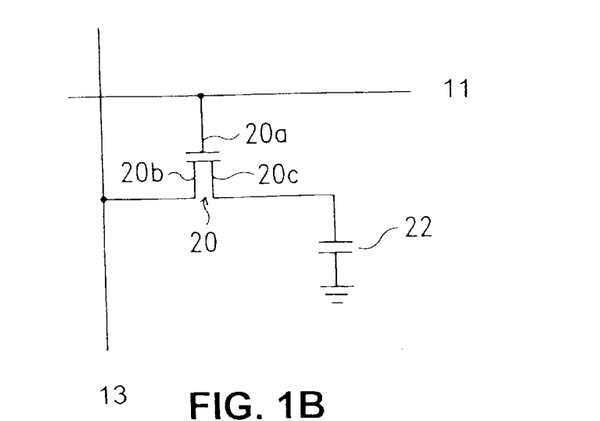
FIG. 1B shows a prior art circuit of a conventional DRAM cell.

Row lines 10 and column lines 12 are used to select one of the plurality of addresses in memory 14. The signals in row lines 10 and column lines 12 are registered in row buffers 15 and column buffers 17 respectively. Subsequently, those signals in buffers 15 and 17 are transmitted to row decoder 16 and column decoder 18 to produce the signals into word lines 11 and bit lines 13 for selecting one of the memory cells. Row decoder 16 and column decoder 18 are used to reduce the number of address lines which access memory 14. An array structure such as the memory system mentioned above has advantages for VLSI design and fabrication. FIG. 1B shows a circuit of a DRAM cell which is composed of a transistor 20 and a storage capacitor 22, wherein the gate terminal 20a of transistor 20 is controlled by the signal in word line 11. Capacitor 22 for data storage is connected with source terminal 20c of transistor 20. Data in capacitor 22 are accessible by drain terminal 20b of transistor and bit line 13.

Figure 2A:
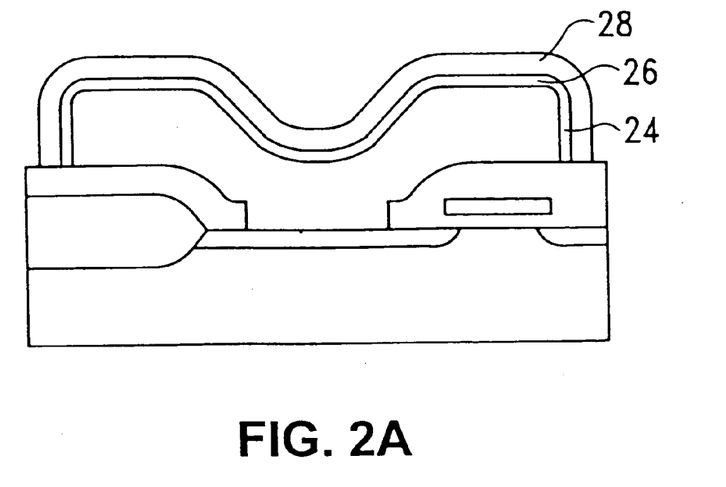
FIG. 2A shows the cross section of a conventional capacitor in a DARM cell.

Because of the low cost per bit, the feasibility of high density, and the convenience for read/write, DRAMs have become the semiconductor memory device of choice. However, with increasing DRAM cell density, the area occupied by the capacitor in a DRAM cell and its capacitance necessarily decreases. FIG. 2A shows the cross section of a conventional capacitor in a DRAM cell which comprises a storage electrode 24, a dielectric layer 26, and a plate electrode 28. When the integration size of the DRAM cells becomes smaller due to the advanced fabrication techniques and the higher cell density, the area occupied by the capacitor in a DRAM cell and the capacitance of the capacitor decrease. Many memory accessing errors are caused by exterior radiation. In order to reduce these errors, a sufficient capacitance is required. Therefore, while the miniaturization of the integration size of the DRAM cells continues, it is also necessary to maximize the capacitance of the capacitors to reduce accessing errors.

Figure 2B:
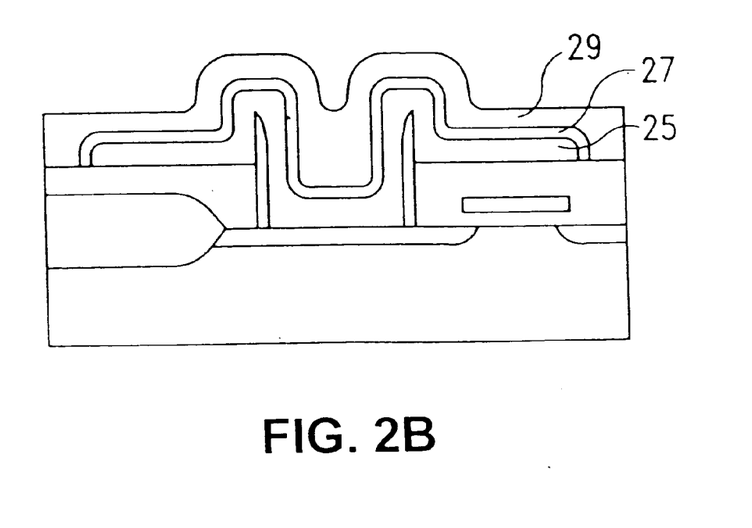
FIG. 2B shows the cross section of another conventional capacitor in a DRAM cell.

For the purpose of increasing the capacitance of the capacitors in the DRAM cells, some methods for forming a fingerlike, cylindrical, rectangular multilayer structure, or spacer in polysilicon layers have been proposed to increase the area of the capacitor electrode. FIG. 2B shows the cross section of another conventional capacitor in a DRAM cell which comprises a storage electrode 25, a dielectric layer 27, and a plate electrode 29. Though the area of the capacitor in FIG. 2B is larger than that in FIG. 2A, the fabrication process will be difficult when the size of DRAM cells decrease. Furthermore, the increment in the capacitance gained by increasing the area of the capacitor electrode is insufficient to compensate for the decrement in the capacitance due to the decreasing size of the DRAM cells.

SUMMARY OF THE INVENTION

In order to overcome the shortcomings mentioned above, the present invention is a memory cell and a method for fabricating such in a semiconductor memory device. The present invention is a ring-like capacitive structure which increases the capacitance of the capacitor while maintaining the high integration of modern DRAM cells. In accordance with one embodiment of the present invention, the capacitor is fabricated by first depositing a dielectric layer over a substrate having a gate electrode, a source region, and a drain region, and then depositing a pad layer over the dielectric layer. A first mask layer is formed on the pad layer, wherein the unmasked pattern of the first mask layer is positioned above the source region of the semiconductor device. The pad layer and dielectric layer are etched through the void region of the first mask layer to expose the surface of the substrate thereby forming a contact window. After stripping the first mask layer, a first conductive layer is deposited over the pad layer and filled into the contact window. A second mask layer is formed on the first conductive layer, wherein the second mask layer is disposed above the contact window. The first conductive layer is etched back via the void region of the second mask layer to form a step-shaped structure including a first-step conductive portion and a second-step conductive portion above the first-step conductive portion. After stripping the second mask layer, a sacrificial layer is formed on the surfaces of the first-step and second-step conductive portions. The sacrificial layer is etched to form a first side-wall spacer surrounding the side walls of the second-step conductive portion. The first-step conductive portion is etched by using the second-step conductive portion and the first side-wall spacer as stops. A second conductive layer is deposited over the exposed surfaces of the second-step conductive portion, the first side-wall spacer, and the pad layer, and then the second conductive layer is etched to form a second side-wall spacer surrounding the side walls of the first side-wall spacer and the first-step conductive portion. After removing the first side-wall spacer, a ring-like conductive structure formed from the second side-wall spacer and the residue of the first- and second-step conductive portions is formed. After removing the pad layer, a capacitive dielectric layer is formed on the surfaces of the ring-like conductive structure and the dielectric layer. A third conductive layer is formed on the surface of the capacitive dielectric layer to act as a storage electrode for the ring-like capacitor. The resulting capacitor is a flat-topped mushroom-shaped concentric cylinders structure which achieves the desired increased capacitance while maintaining small cell size.

A further understanding of the nature and advantages of the present invention may be realized by reference to the remaining portions of the specification and the drawings.

DESCRIPTION OF THE INVENTION

Figure 3:
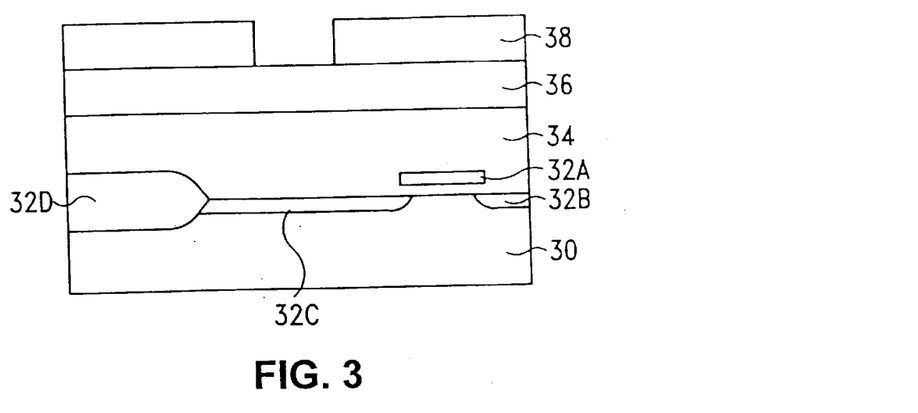
FIGS. 3–13 show the stages of the fabrication process for a DRAM ring-like capacitor in accordance with the present invention.

FIG. 3 shows the cross section of a MOSFET on a substrate 30, which comprises at least a gate electrode 32A, a drain region 32B, and a source region 32C. There is a field oxide layer 32D between adjoining MOSFETs for insulation. A dielectric layer 34 of approximately 3000–10000 Å thickness is deposited over a substrate 30 and the transistor for insulation. In an embodiment of the present invention, the dielectric layer 34 is a silicon dioxide layer, which is formed by a CVD (chemical vapor deposition) technique. Because of the good uniformity and step coverage of tetraethoxysilane (TEOS), it can be used for forming the dielectric layer 34. TEOS can be generated at temperatures of 650–750° C. and at low pressures by decomposing $Si(C_2H_5O)_4$ with or without oxygen. TEOS could be replaced by borosilicate glass (BSG), phosphosilicate glass (PSG), or borophosphosilicate glass (BPSG), wherein BSG is produced by oxidizing $B_2H_6$ (diborane) and $SiH_4$ PSG is produced by oxidizing $SiH_4$ and $PH_3$ (phosphine). Thereafter, a silicon nitride layer 36 of 300–2000 Å thickness is deposited over the surface of the dielectric layer 34 by conventional LPCVD (low-pressure chemical vapor deposition) or PECVD (plasma-enhanced chemical vapor deposition) technique as a pad layer which acts as a stop layer for the etching process.

Figure 4:
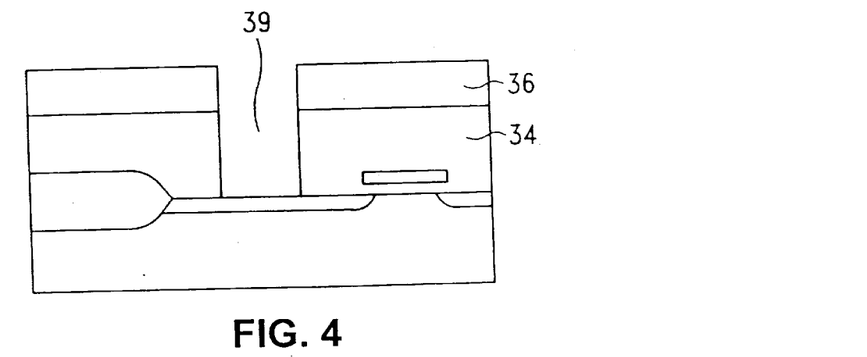

A mask pattern of a photoresist layer 38 is formed on the silicon nitride layer 36 by using the conventional photographic and photoresist film techniques to form a void region, wherein the void region of the photoresist layer 38 is positioned above the source region of the MOSFET. Referring to FIG. 4, the silicon nitride layer 36 and the dielectric layer are etched through the void region of the photoresist layer 38 to expose the surface of the substrate 30 thereby forming a contact window 39.

Figure 5:
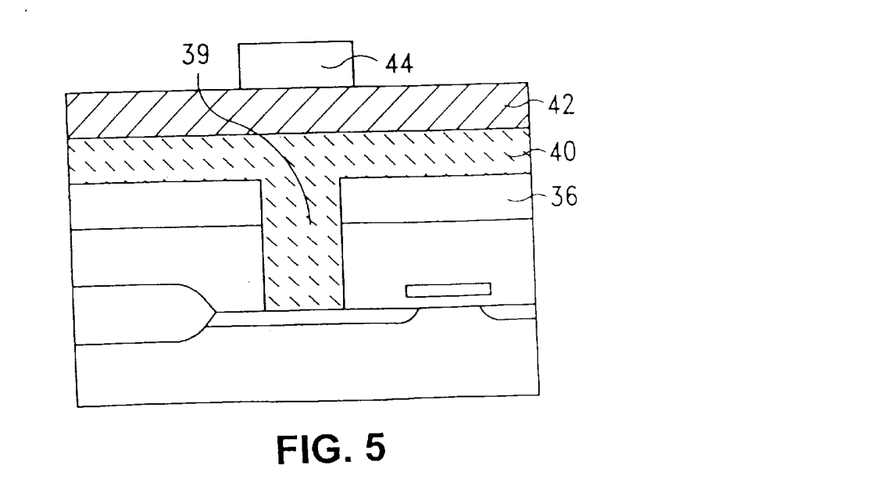

Referring to FIG. 5, after stripping the photoresist layer 38, a pair of polysilicon layers 40 and 42 of approximately 1000–8000 Å thickness are deposited over the silicon nitride layer 36 as conductive layers by using the conventional LPCVD. Polysilicon layer 40 is filled into the contact window 39. In the best embodiment of the present invention, the polysilicon layers 40 and 42 are formed by using LPCVD at temperatures of 500–650° C. and pressures of 0.1–1.0 torr to decompose $SiH_4$ in accordance with the reactive equations:

$$SiH_4 \rightarrow Si+2H_2 \text{ or } SiCl_2H_2 \rightarrow Si+2HCl$$

The polysilicon layers 40 and 42 could be replaced by a single thicker polysilicon layer to generate the same ring-like capacitor structure. The major difference between using two polysilicon layers and a single thick polysilicon is that there is a thin native oxide layer which is used as a layer boundary while etching proceeds.

Figure 6:
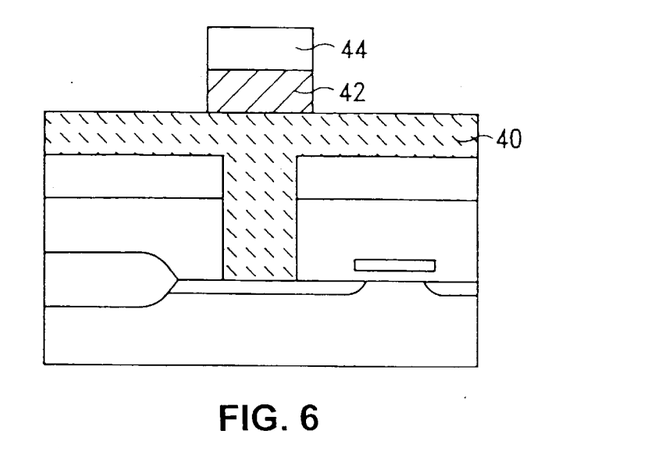

The polysilicon layers 40 and 42 are doped to reduce the resistivity by in situ doping with mixing arsenic (or phosphorus) and $SiH_4$. An alternative doping method is to use ion implantation after polysilicon film is deposited. The dopant concentration in the polysilicon layers 40 and 42 can be the same (e.g., $10^{18}$–$10^{22}$ atoms/cm$^3$). They can also be doped by using different dopant concentrations (e.g., $10^{18}$–$10^{20}$ atoms/cm$^3$ in the lower layer 40 and $10^{20}$–$10^{22}$ atoms/cm$^3$ in the upper layer 42). The merit of using different dopant concentration is that the etch rate in the upper layer 42 is faster than that in the lower layer 40 (See FIG. 6). Further, the ions doped in the upper layer 42 will be diffused into the contact window 39 during the oxidation operation(See FIG. 7).

Referring to FIG. 5, a mask pattern of a photoresist layer 44 disposed above the contact window 39 is formed on the polysilicon layer 42 by using the conventional photographic and photoresist film techniques. There is no need to match the position of the pattern and that of the contact window precisely. The only requirement is for the mask pattern to be above the contact window. The polysilicon layer 42 is etched through the void region of the photoresist layer 44 to expose the surface of the polysilicon layer 40. In the best embodiment of the present invention, the native oxide layer between the polysilicon layers 40 and 42 is used as the layer boundary for etching. If the polysilicon layers 40 and 42 are replaced by a single thick polysilicon layer, the single thick polysilicon layer is etched back through the void region of the photoresist layer 44 to form a step-shaped structure. This step-shaped structure includes a first-step conductive portion and a second-step conductive portion which is above the first-step conductive portion. The first-step and second-step conductive portions are the counterparts of the polysilicon layers 40 and 42 respectively shown in FIG. 6.

Figure 7:
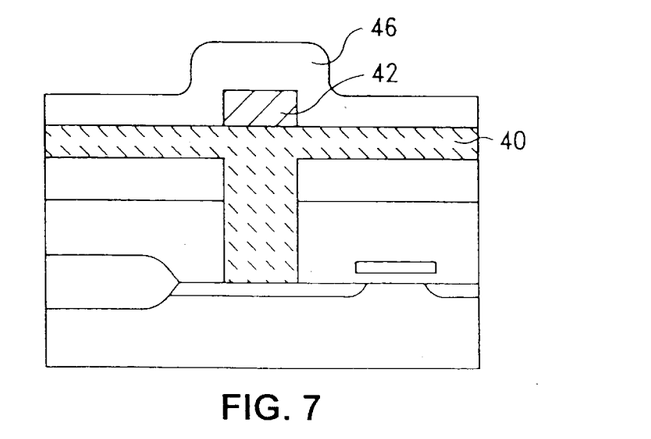

Referring to FIG. 7, after stripping the photoresist layer 44, an oxide layer 46 of approximately 500–2000 Å thickness are formed on the surfaces of the polysilicon layers 40 and 42 at temperatures of 700–1000° C. in the furnace chamber by using thermal oxidation of silicon in oxygen or water vapor. As shown in FIG. 7, the exposed surfaces of the polysilicon layers 40 and 42 will be lightly oxidized to grow the oxide layer 46 during the thermal oxidation operation. The oxide layer 46 also can be formed by other conventional methods such as oxidation with higher operating pressures (10–20 atmospheres). It also can be replaced by other materials because the oxide layer 46 is used as a sacrificial layer in this embodiment of the present invention and will be removed after fabricating a capacitor in a DPAM cell.

The oxide layer 46 and the polysilicon layer 40 are etched back with the conventional etch back technique (e.g., dry etching). The oxide layer 46 is etched to form an oxide side-wall spacer surrounding the side walls of the polysilicon layer 42 shown in FIG. 8. Next, the polysilicon layer 40 is etched by using the polysilicon layer 42 and the oxide side-wall spacer surrounding the side walls of the polysilicon layer 42 as stops. In the best embodiment of the present invention, a plasma etching technique such as reactive ion etching (RIE) using the reactive gas with high etch rate (e.g., $CHF_3/O_2$) for silicon dioxide is used to etch the oxide layer 46 The reactive gas with high polysilicon to silicon dioxide etch rate ratio, such as $SF_6/O_2$ with the ratio of 20:1 and etch rate of 400–680 nm/min., is selected to etch the polysilicon layer 40. The silicon nitride layer 36 is used as a pad layer which functions as the stop layer for etching the polysilicon layer 40.

Figure 8:
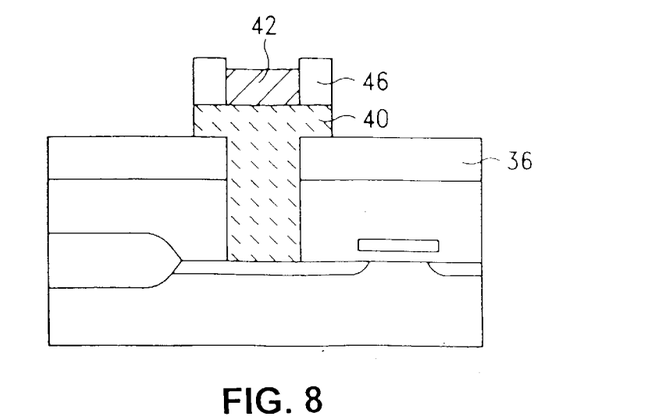
Figure 9:
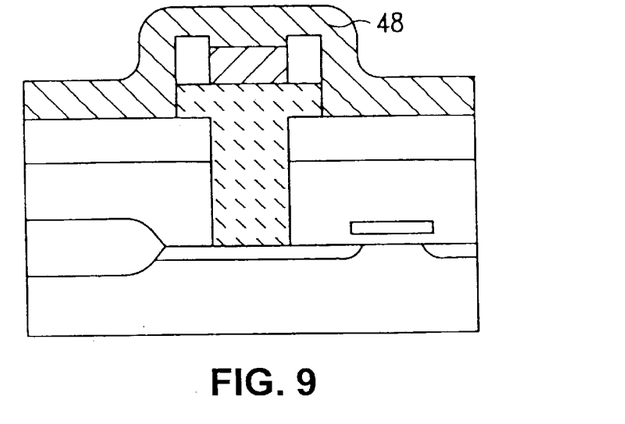

Referring to FIG. 9, the polysilicon layer 48 of 300–2000 Å thickness is deposited over the exposed surfaces of the polysilicon layer 42, the oxide side-wall spacer surrounding the side walls of the polysilicon layer 42, the polysilicon layer 40, and the silicon nitride layer 36 shown in FIG. 8. In the best embodiment of the present invention, the polysilicon layer 48 is deposited using the same method for forming the polysilicon layers 40 and 42 by using LPCVD at temperatures of 500–650° C. and pressures of 0.1–1.0 torr to decompose $SiH_4$ in accordance with the reactive equations:

$$SiH_4 \rightarrow Si+2H_2 \text{ or } SiCl_2H_2 \rightarrow Si+2HCl$$

The polysilicon layers 48, in the best embodiment of the present invention, is doped to reduce the resistivity by in situ doping with mixing arsenic (or phosphorus) and $SiH_4$. An alternative doping method is to use ion implantation after a polysilicon film is deposited.

Figure 10:
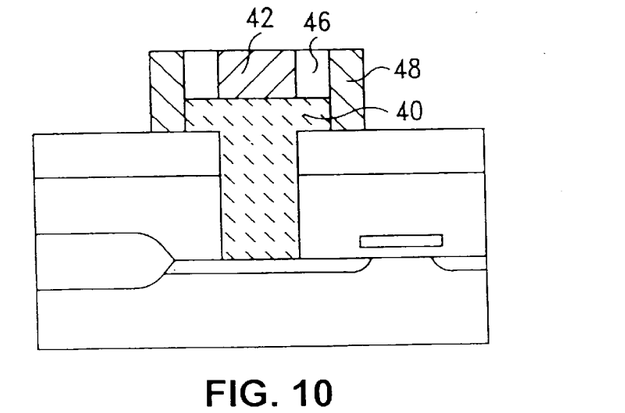

The polysilicon layer 48 is etched back by using the conventional etch back technique (e.g., dry etching) to form the polysilicon side-wall spacer shown in FIG. 10 surrounding the side walls of the polysilicon layer 40 and the oxide side-wall spacer surrounding the side walls of the polysilicon layer 42. In the best embodiment of the present invention, a plasma etching technique such as reactive ion etching (RIE) is used to etch the polysilicon layer 48. A reactive gas with high polysilicon to silicon dioxide etch rate ratio, such as $SF_6/O_2$ with the ratio of 20:1 and etch rate of 400–680 nm/min., is selected to etch the polysilicon layer 48. The silicon nitride layer 36 functions as a stop layer for etching the polysilicon layer 48.

Figure 11:
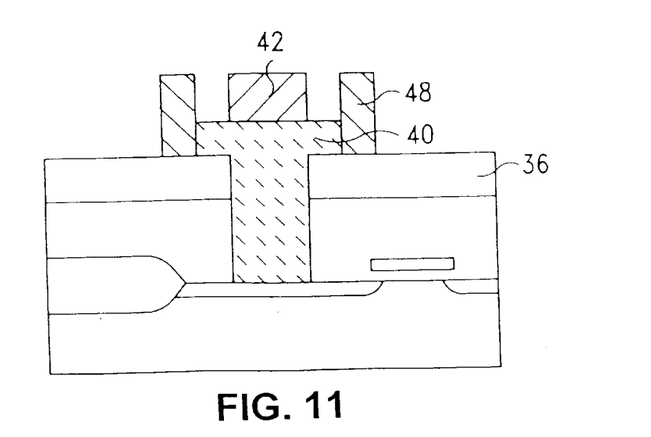

Referring to FIG. 11, the oxide side-wall spacer surrounding the side walls of the polysilicon layer 42 is removed by using a conventional etching technique such as wet etching. In the best embodiment of the present invention, the oxide side-wall spacer surrounding the side walls of the polysilicon layer 42 is removed by using the diluted HF solution or HF vapor.

Figure 12:
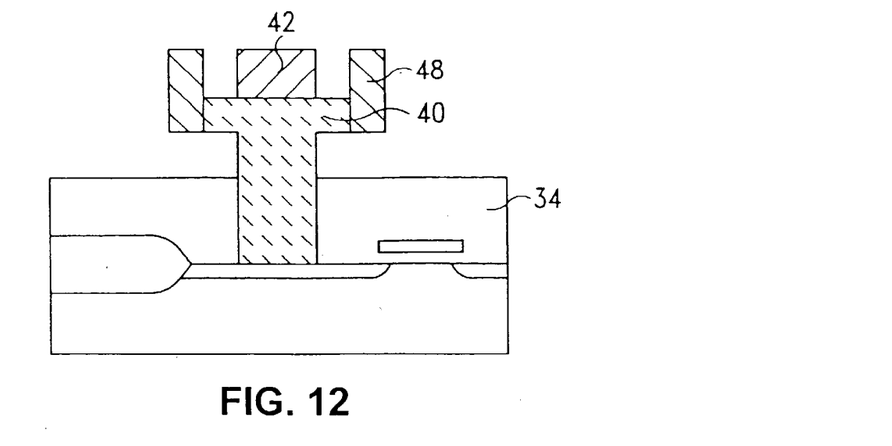

As shown in FIG. 12, the silicon nitride layer 36 is removed by using a conventional etching technique such as wet etching. In the embodiment of the present invention, the silicon nitride layer 36 is removed by using a boiling $H_3PO_4$ solution at temperatures of 140–180° C., thereby forming a ring-like structure. The ring-like structure has a plurality of substantially conductive concentric cylindrical members including the residue of the polysilicon layer 40 which forms a mushroom-shaped member having a flat-headed cap and a stem coupled to the source region 32C, the residue of the polysilicon layer 42 being a solid cylindrical member disposed on the residue of the polysilicon layer 40, and the polysilicon side-wall spacer being a hollow cylindrical member shown in FIG. 12.

Figure 13:
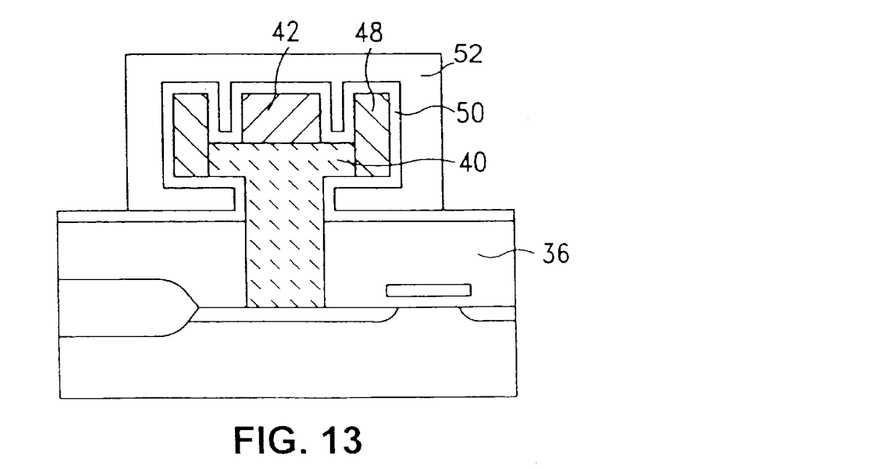
Figure 14:
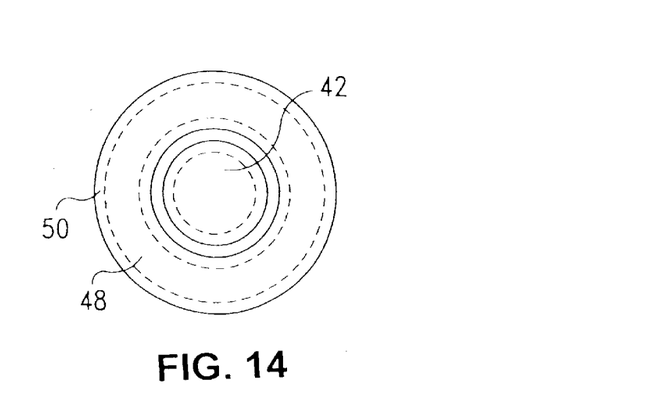
FIG. 14 shows a top view of the ring-like capacitor structure of the DRAM cell in accordance with the present invention.

As shown in FIG.13, a thin dielectric layer 50 such as the Oxide-Nitride-Oxide (ONO) stacked layer is formed on the surfaces of the ring-like structure mentioned above and the dielectric layer 34. Because the ONO stacked layer 50 can be stably formed on the surface of shaped polysilicon, it is usually used as the dielectric of a capacitor. First, the silicon dioxide layer is formed as the underlying layer of the ONO stacked layer by using a conventional thermal oxidation technique; the silicon nitride layer is formed as the intermediate layer of the ONO stacked layer by using the LPCVD technique; the silicon dioxide layer is formed as the upper layer of the ONO stacked layer by using a conventional thermal oxidation technique. The ONO also can be replaced by other materials such as $BaSiTiO_3$ (BST), lead zirconate titanate (PZT), $Ta_2O_5$, or other high-resistivity materials. Finally, the conductive layer 52 is formed on the surface of the thin dielectric layer 50 to act as the storage electrode for the ring-like capacitor in a DRAM cell. FIG. 14 shows the top view of the ring-like capacitor in a DRAM cell in accordance with the present invention.

This invention has been described as a particular embodiment thereof. Accordingly, the above description and illustrations should not be construed as limiting the scope of the invention. Various changes and modifications may be made by those skilled in the art without changing the scope or spirit of the invention which is defined by the following claims.

What is claimed is:

1. A method for fabricating a ring capacitor in a semiconductor memory device, comprising the steps of:
   (a) depositing a dielectric layer over a substrate having a gate electrode, a source region, and a drain region;
   (b) depositing a pad layer over said dielectric layer;
   (c) forming a first mask layer on said pad layer, the unmasked pattern of said first mask layer being positioned above said source region;
   (d) etching said pad layer and said dielectric layer through a void region of said first mask layer to expose the surface of said substrate thereby forming a contact window;
   (e) stripping said first mask layer;
   (f) depositing a first conductive layer over said pad layer and filling into said contact window;
   (g) depositing a second conductive layer over said first conductive layer:
   (h) forming a second mask layer on said second conductive layer, said second mask layer being disposed above said contact window;
   (i) etching back said second conductive layer via the void region of said second mask layer to expose the surface of said first conductive layer;
   (j) stripping said second mask layer;
   (k) forming a sacrificial layer on the surfaces of said first conductive layer and said second conductive layer;
   (l) etching said sacrificial layer to form a first side-wall spacer surrounding the side walls of said second conductive layer;
   (m) etching said first conductive layer by using said second conductive layer and said first side-wall spacer as stops;
   (n) depositing a third conductive layer over the exposed surfaces of said second conductive layer, said first side-wall spacer, and said pad layer;
   (o) etching said third conductive layer to form a second side-wall spacer surrounding the side walls of said first side-wall spacer and said first conductive layer;
   (p) removing said first side-wall spacer to form a ring conductive structure formed from said second side-wall spacer and the residue of said first conductive layer and said second conductive layer;
   (q) removing said pad layer;
   (r) forming a capacitive dielectric layer on the surfaces of said ring conductive structure and said dielectric layer; and
   (s) forming a fourth conductive layer on the surface of said capacitive dielectric layer to act as a storage electrode for said ring capacitor.

2. The method of claim 1, wherein said dielectric layer consists essentially of silicon dioxide.

3. The method of claim 1, wherein said pad layer consists essentially of silicon nitride.

4. The method of claim 1, wherein said first conductive layer consists essentially of doped polysilicon.

5. The method of claim 1, wherein said sacrificial layer consists essentially of silicon dioxide.

6. The method of claim 5, wherein said sacrificial layer is formed by thermal oxidation.

7. The method of claim 1, wherein said capacitive dielectric layer material is selected from the group of high-resistivity materials consisting of Oxide-Nitride-Oxide (ONO) stacked layer, BaSiTiO$_3$ (BST), lead zirconate titanate (PZT), and Ta$_2$O$_5$.

8. A method for fabricating a capacitor in a semiconductor memory device, comprising the steps of:

(a) depositing a dielectric layer over a substrate having a gate electrode, a source region, and a drain region;

(b) depositing a pad layer over said dielectric layer;

(c) forming a first mask layer on said pad layer, the unmasked pattern of said first mask layer being positioned above said source region;

(d) etching said pad layer and said dielectric layer through a void region of said first mask layer to expose the surface of said substrate thereby forming a contact window;

(e) stripping said first mask layer;

(f) depositing a first doped polysilicon layer over said pad layer and filling into said contact window;

(g) depositing a second doped polysilicon layer over said first doped polysilicon layer;

(h) forming a second mask layer on said second doped polysilicon layer, said second mask layer being disposed above said contact window;

(i) etching said second doped polysilicon layer through the void region of said second mask layer to expose the surface of said first doped polysilicon layer;

(j) stripping said second mask layer;

(k) forming a sacrificial layer on the surfaces of said second doped polysilicon layer and said first doped polysilicon layer;

(l) etching back said sacrificial layer and said first doped polysilicon layer to expose the surface of said pad layer;

(m) depositing a third doped polysilicon layer over the exposed surfaces of said second doped polysilicon layer, said sacrificial layer, and said pad layer;

(n) etching back said third doped polysilicon layer to expose the surface of said pad layer thereby forming a polysilicon side-wall spacer surrounding the side walls of said first doped polysilicon layer and said sacrificial layer;

(o) removing said sacrificial layer to form a ring polysilicon structure formed from said polysilicon side-wall spacer and the residue of said first and second doped polysilicon layers;

(p) removing said pad layer;

(q) forming a capacitive dielectric layer on the surfaces of said ring polysilicon and said dielectric layer; and (r) forming a conductive layer on the surface of said capacitive dielectric layer to act as a storage electrode for said ring capacitor.

9. The method of claim 8, wherein said dielectric layer consists essentially of silicon dioxide.

10. The method of claim 8, wherein said pad layer consists essentially of silicon nitride.

11. The method of claim 8, wherein the dopant concentration in said first and second doped polysilicon layers is approximately equal.

12. The method of claim 8, wherein the dopant concentration in said first doped polysilicon layer is higher than that in said second doped polysilicon layer.

13. The method of claim 8, wherein said sacrificial layer consists essentially of silicon dioxide.

14. The method of claim 13, wherein said sacrificial layer is formed by thermal oxidation.

15. The method of claim 8, wherein said first, second, and third doped polysilicon layers are formed by using in situ doping technique.

16. The method of claim 8, wherein said first, second, and third doped polysilicon layers are formed by using ion implantation technique.

17. The method of claim 8, wherein said capacitive dielectric layer material is selected from the group of high-resistivity materials consisting of ONO stacked layer, BST, PZT, and Ta$_2$O$_5$.

18. A method for fabricating a ring capacitor in a semiconductor memory device, comprising the steps of:

(a) depositing a dielectric layer over a substrate having a gate electrode, a source region, and a drain region;

(b) depositing a pad layer over said dielectric layer;

(c) forming a first mask layer on said pad layer, the unmasked pattern of said first mask layer being positioned above said source region;

(d) etching said pad layer and said dielectric layer through a void region of said first mask layer to expose the surface of said substrate thereby forming a contact window;

(e) stripping said first mask layer;

(f) depositing a first conductive layer over said pad layer and filling into said contact window;

(g) depositing a second conductive layer over said first conductive layer;

(h) forming a second mask layer on said second conductive layer, said second mask layer being disposed above said contact window;

(i) etching back said second conductive layer via the void region of said second mask layer to expose the surface of said first conductive layer;

(j) stripping said second mask layer;

(k) forming a sacrificial layer on the surfaces of said second conductive layer and said first conductive layer;

(l) etching back said sacrificial layer and said first conductive layer to expose the surface of said pad layer;

(m) depositing a third conductive layer over the exposed surfaces of said second conductive layer, said sacrificial layer, and said pad layer;

(n) etching back said third conductive layer to expose the surface of said pad layer thereby forming a side-wall spacer surrounding the side walls of said first conductive layer and said sacrificial layer;

(o) removing said sacrificial layer to form a ring conductive structure formed from said side-wall spacer and the residue of said first conductive layer and said second conductive layer;

(p) removing said pad layer;

(q) forming a capacitive dielectric layer on the surface of said ring conductive structure and said dielectric layer; and (r) forming a fourth conductive layer on the surface said capacitive dielectric layer to act as a storage electrode for said ring capacitor.

19. The method of claim 18, wherein said dielectric layer consists essentially of silicon dioxide.

20. The method of claim 18, wherein said pad layer consists essentially of silicon nitride.

21. The method of claim 18, wherein said sacrificial layer consists essentially of silicon dioxide.

22. The method of claim 21, wherein said sacrificial layer is formed by thermal oxidation.

23. The method of claim 18, wherein said capacitor dielectric layer material is selected front the group of high-resistivity materials consisting of ONO stacked layer, BST, PZT, and $Ta_2O_5$.

24. The method of claim 18, wherein said first, second, and third conductive layers consist essentially of doped polysilicon.

25. The method of claim 24, wherein the dopant concentration in said first and second conductive layers is approximately equal.

26. The method of claim 24, wherein the dopant concentration in said first conductive layer is higher than that in said second conductive layer.

27. The method of claim 24, wherein said first, second, and third conductive layers are formed by using in situ doping technique.

28. The method of claim 24, wherein said first, second, and third conductive layers are formed by using ion implantation technique.

* * * * *